(12) United States Patent
Lai et al.

(10) Patent No.: US 11,688,611 B2
(45) Date of Patent: Jun. 27, 2023

(54) METHOD FOR MANUFACTURING A CAPACITOR

(71) Applicant: NANYA TECHNOLOGY CORPORATION, New Taipei (TW)

(72) Inventors: Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 431 days.

(21) Appl. No.: 16/933,976

(22) Filed: Jul. 20, 2020

(65) Prior Publication Data

US 2022/0020752 A1 Jan. 20, 2022

(51) Int. Cl.
| | |
|---|---|
| *H01L 21/3213* | (2006.01) |
| *H01L 21/311* | (2006.01) |
| *H01L 49/02* | (2006.01) |
| *H10B 12/00* | (2023.01) |

(52) U.S. Cl.
CPC .. *H01L 21/32135* (2013.01); *H01L 21/31116* (2013.01); *H01L 28/90* (2013.01); *H10B 12/03* (2023.02)

(58) Field of Classification Search
CPC ......... H01L 21/32132; H01L 21/31116; H01L 27/1085; H01L 28/90
See application file for complete search history.

(56) References Cited

U.S. PATENT DOCUMENTS

| | | | | |
|---|---|---|---|---|
| 2006/0115946 A1* | 6/2006 | Kim | ........................ | H01L 28/91 438/254 |
| 2009/0241998 A1* | 10/2009 | Kesil | ................. | H01L 21/67028 134/102.1 |
| 2014/0030863 A1* | 1/2014 | Lugani | ................... | H01G 4/005 438/381 |
| 2014/0261803 A1* | 9/2014 | Wang | ...................... | H01L 21/00 137/599.01 |
| 2015/0294971 A1* | 10/2015 | Sapra | ...................... | H01L 28/75 257/532 |
| 2015/0333117 A1* | 11/2015 | Sako | ................. | H01L 21/02063 257/532 |
| 2016/0027979 A1* | 1/2016 | Haushalter | ................ | F21K 9/20 362/382 |
| 2017/0187322 A1* | 6/2017 | Pisharodi | .............. | H01L 31/054 |
| 2020/0111684 A1* | 4/2020 | Choi | ..................... | H01L 21/565 |
| 2020/0161337 A1* | 5/2020 | Song | ...................... | H01L 27/124 |
| 2020/0212169 A1* | 7/2020 | Kim | ........................ | H01L 28/91 |
| 2022/0089947 A1* | 3/2022 | Nomiyama | ............. | C01F 17/34 |
| 2022/0145176 A1* | 5/2022 | Nomiyama | ........... | H01L 33/502 |

* cited by examiner

*Primary Examiner* — Brigitte A Paterson
(74) *Attorney, Agent, or Firm* — CKC & Partners Co., LLC

(57) ABSTRACT

A method for manufacturing a capacitor includes: providing a substrate and a multilayer structure; forming a recess in the multilayer structure; forming a first electrode layer on a surface of the recess; performing a selective etching treatment to remove the first and second stack material layers; performing a selective vapor phase etching treatment to the first electrode layer to form a smaller thickness of the first electrode layer; and forming a dielectric layer and a second electrode layer in which the dielectric layer is between the first and second electrode layer.

17 Claims, 8 Drawing Sheets

METHOD FOR MANUFACTURING A CAPACITOR

BACKGROUND

Field of Invention

The present invention relates to a method for forming a semiconductor device. More particularly, the present invention relates to forming a capacitor.

Description of Related Art

Regarding semiconductor devices, such as a Dynamic Random Access Memory (DRAM), it has been known that a capacitor, which has the same structure as of a memory cell capacitor, is used as a compensation capacitor.

As the recent tendency, capacitance of the memory cell capacitor has become critical in order to support electrical devices' multifunction. If the capacitance is not high enough, some functions thereof may not operate well or even stop.

Therefore, there is a need to develop a method to increase capacitance of memory cell capacitors and solve the aforementioned problems.

SUMMARY

A method for manufacturing a capacitor includes: providing a substrate and a multilayer structure; forming a recess in the multilayer structure; forming a first electrode layer on a surface of the recess; performing a selective etching treatment to remove a first stack material layer and second stack material layer of the multilayer structure; performing a selective vapor phase etching treatment to the first electrode layer to form a smaller thickness of the first electrode layer; and forming a dielectric layer and a second electrode layer in which the dielectric layer is between the first and second electrode layer.

In some embodiments of the present disclosure, the first stack material layer includes borophosphosilicate glass.

In some embodiments of the present disclosure, the second stack material layer includes tetraethyl orthosilicate.

In some embodiments of the present disclosure, a first supporting layer, a second supporting layer, and a third supporting layer of the multilayer structure include silicon nitride.

In some embodiments of the present disclosure, the first electrode layer includes titanium nitride.

In some embodiments of the present disclosure, performing the selective etching treatment to remove the first and second stack material layers includes forming an open in each of the second and third supporting layers.

In some embodiments of the present disclosure, the method further includes exposing the multilayer structure to a protective gas containing hydrogen before performing the selective vapor phase etching treatment to the first electrode layer, such that a protective film is formed on each surface of the first supporting layer, the second supporting layer, and the third supporting layer.

In some embodiments of the present disclosure, the protective gas containing hydrogen includes $H_2$ or $NH_3$.

In some embodiments of the present disclosure, the protective film includes $Si_3N_4H$.

In some embodiments of the present disclosure, performing the selective vapor phase etching treatment to the first electrode layer includes exposing the multilayer structure to an etching gas containing a fluorine compound. The fluorine compound includes HF, $NF_3$, $CF_4$, or $SF_6$.

In some embodiments of the present disclosure, the first electrode layer is in contact with a conductive structure in the substrate. The conductive structure includes tungsten.

In some embodiments of the present disclosure, the method further includes exposing the substrate to a protective gas containing hydrogen before performing the selective vapor phase etching treatment to the first electrode layer, such that a protective film is formed on the conductive structure. The protective film includes tungsten hydride.

In some embodiments of the present disclosure, the first electrode layer is substantially funnel-shaped.

In some embodiments of the present disclosure, an outer diameter of the first electrode layer equal to or greater than 36 nm is obtained after performing the selective vapor phase etching treatment to the first electrode layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
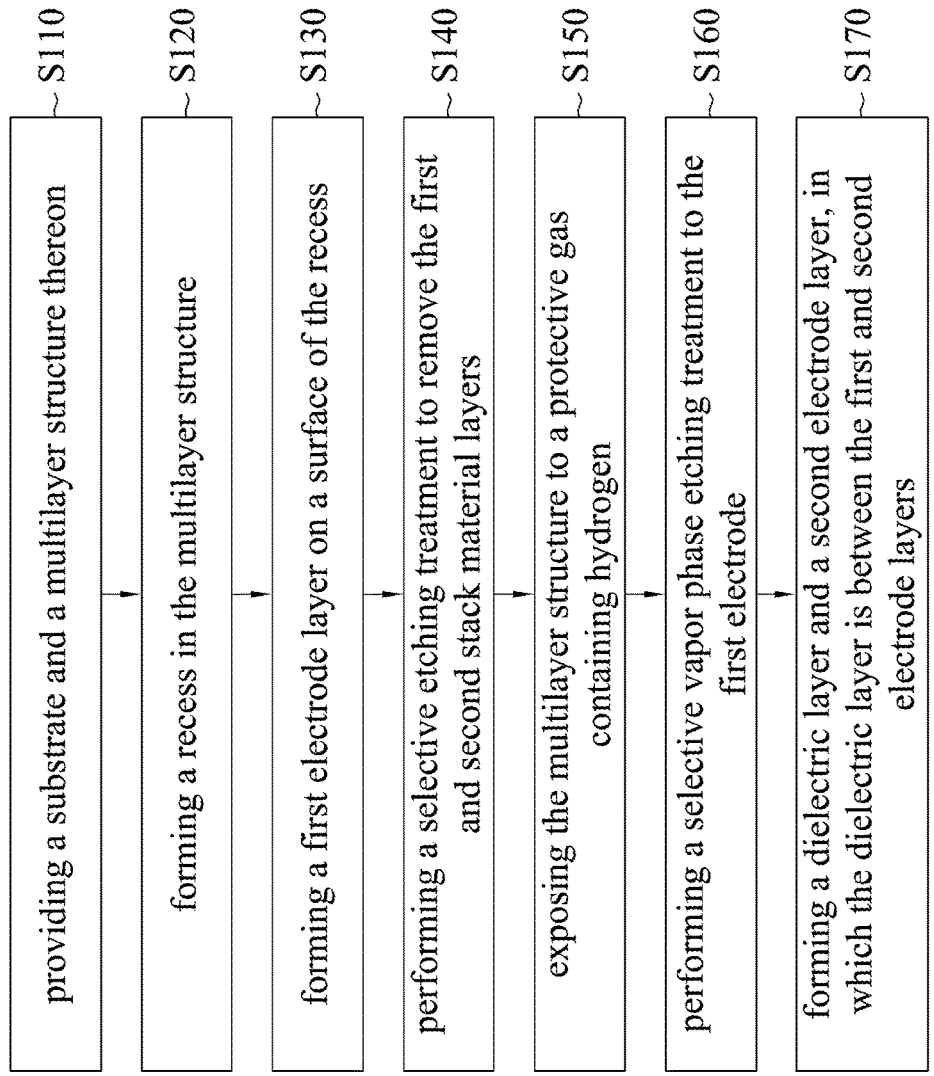
FIG. 1 is a flowchart of a method for fabricating a capacitor in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

FIG. 1 is a flowchart of a method 100 for fabricating a capacitor in accordance with some embodiments of the present disclosure. The method 100 begins with Step 110 in which a substrate and a multilayer structure formed are provided, and the multilayer structure is formed on the substrate. The method 100 then continues with Step 120 in which a recess is formed in the multilayer structure. Next, the method 100 continues with Step 130 in which a first electrode layer is formed on a surface of the recess. The method 100 continues with Step 140 in which a selective etching treatment is performed to remove a first stack material layer and a second stack material layer of the multilayer structure. The method 100 continues with Step 150 in which the multilayer structure is exposed to a protective gas containing hydrogen. Thereafter, the method 100 continues with Step 160 in which a selective vapor phase etching treatment is performed to the first electrode layer to form a smaller thickness of the first electrode layer. The method 100 continues with Step 170 in which a dielectric layer and a second electrode layer are form, and the dielectric layer is between the first electrode layer and second electrode layer, such that a capacitor is then obtained.

Figure 2:
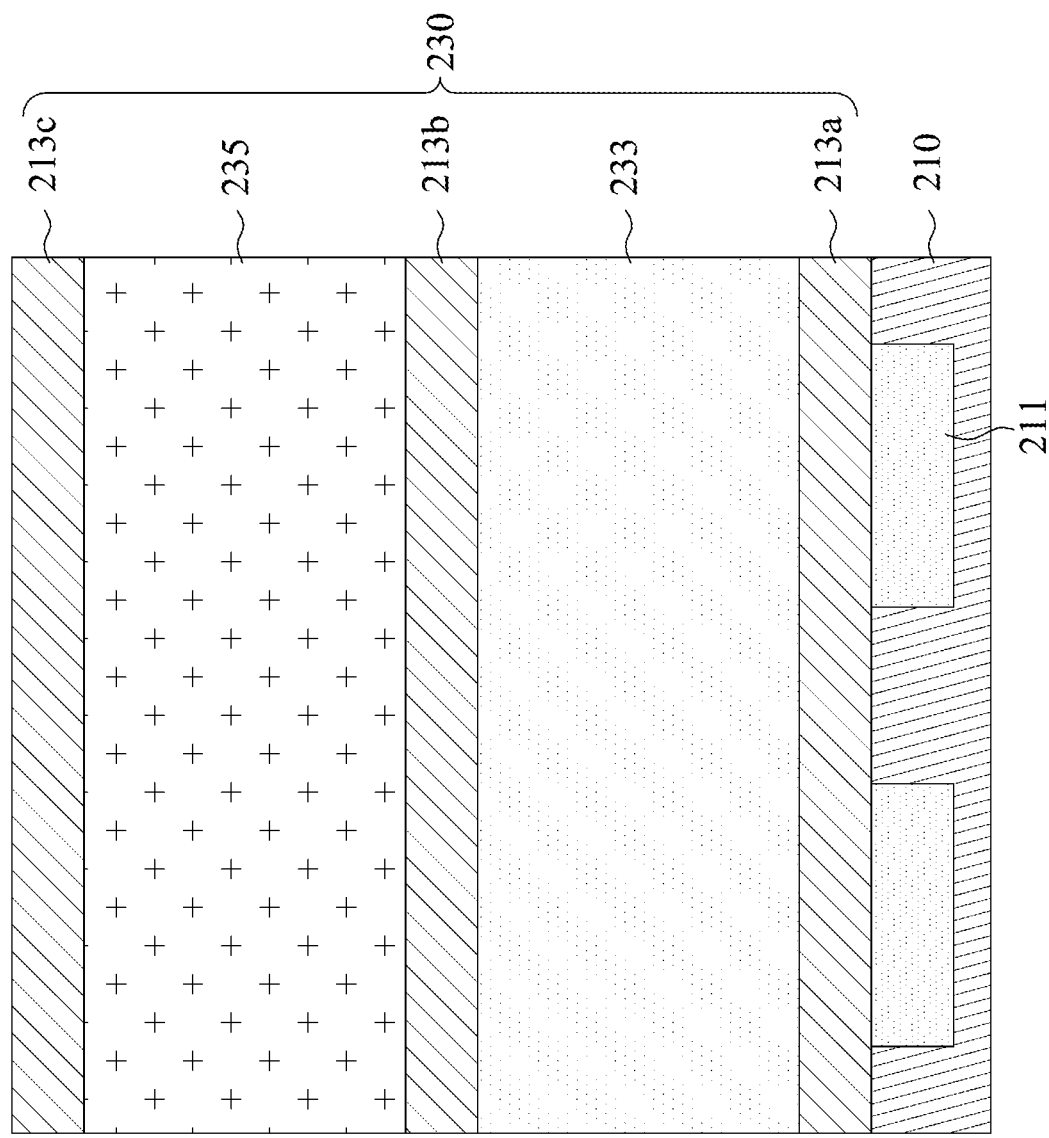
FIG. 2-FIG. 8 are cross-sectional views of intermediate stages of a method for fabricating a capacitor in accordance with some embodiments of the present disclosure.

FIG. 2 through FIG. 8 schematically depict perspective views of a process flow of the method 100 for forming a capacitor 200 in accordance with some embodiments of the present disclosure. Reference is made to FIG. 1 and FIG. 2. FIG. 2 illustrates the details about Step 110 in FIG. 1. In Step 110, a substrate 210 and a multilayer structure 230 are provided, and the multilayer structure 230 is formed on the substrate 210. The multilayer structure 230 includes a first supporting layer 231a located on the substrate 210, a first stack material layer 233 on the first supporting layer 231a, a second supporting layer 231b on the first stack material layer 233, a second stack material layer 235 on the second supporting layer 231b, and a third supporting layer 231c on the second stack material layer 235.

Specifically, the substrate 210 includes any construction containing semiconductive material, including, but not limited to, bulk semiconductive materials such as a semiconductive wafer (either alone or in assemblies comprising other materials), and semiconductive material regions (either alone or in assemblies comprising other materials). The substrate 210 includes a conductive structure 211 therein, and the conductive structure 211 includes a conductive material, such as tungsten (W) or an alloy thereof. Moreover, the first supporting layer 231a is in contacts with conductive structure 211.

The first stack material layer 233 and the second stack material layer 235 may include one or more of silicate glass (for instance, borophosphosilicate glass (BPSG), phosphosilicate glass, fluorosilicate glass, etc.), spin-on-dielectric, and tetraethyl orthosilicate (TEOS), or may be a semiconductive layer such as amorphous silicon or polysilicon. In an embodiment of the present disclosure, the first stack material layer 233 includes borophosphosilicate glass (BPSG), and the second stack material layer includes tetraethyl orthosilicate (TEOS). The present disclosure is not limited in this respect.

The supporting layers 231a, 231b, 231c include silicon nitride such as $Si_3N_4$. The supporting layers 231a, 231b, 231c as well as the stack material layers 233, 235 can be formed by using a deposition process such as, for example, chemical vapor deposition (CVD), plasma enhanced chemical vapor deposition CVD (PECVD), physical vapor deposition (PVD), or other suitable deposition processes.

Figure 3:
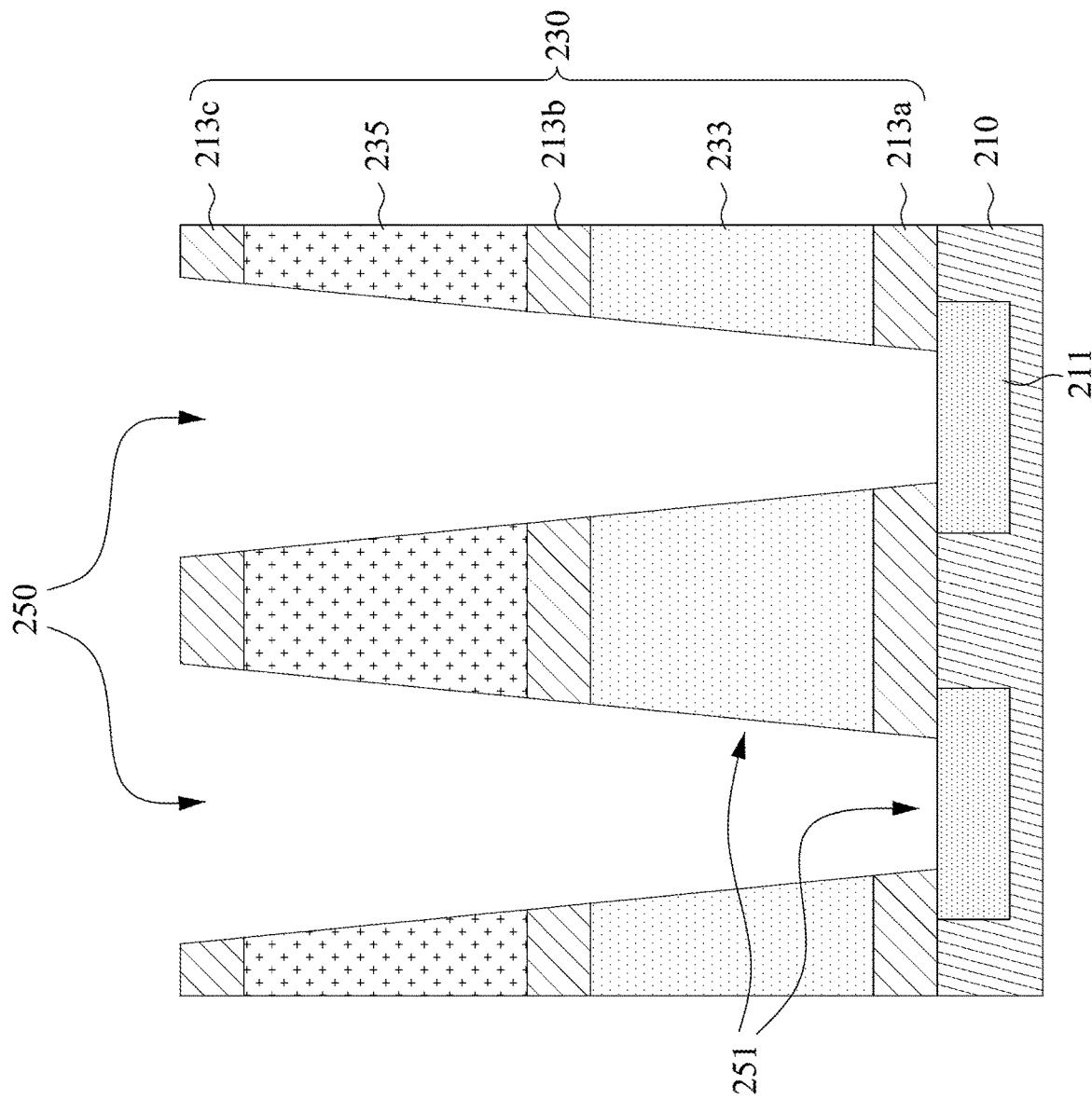

Reference is made to FIG. 2 and FIG. 3. FIG. 2 and FIG. 3 illustrate the details about Step 120 in FIG. 1, in which a recess 250 is formed in the multilayer structure 230. The recess 250 extends through the entire thickness of the multilayer structure 230 and exposes the conductive structure 211 thereunder. The recess 250 can be formed by using a dry etching process such as an anisotropic etching process. The anisotropic etching process can include a reactive ion etching (RIE) process or a plasma etching process. The present disclosure is not limited in this respect.

Figure 4:
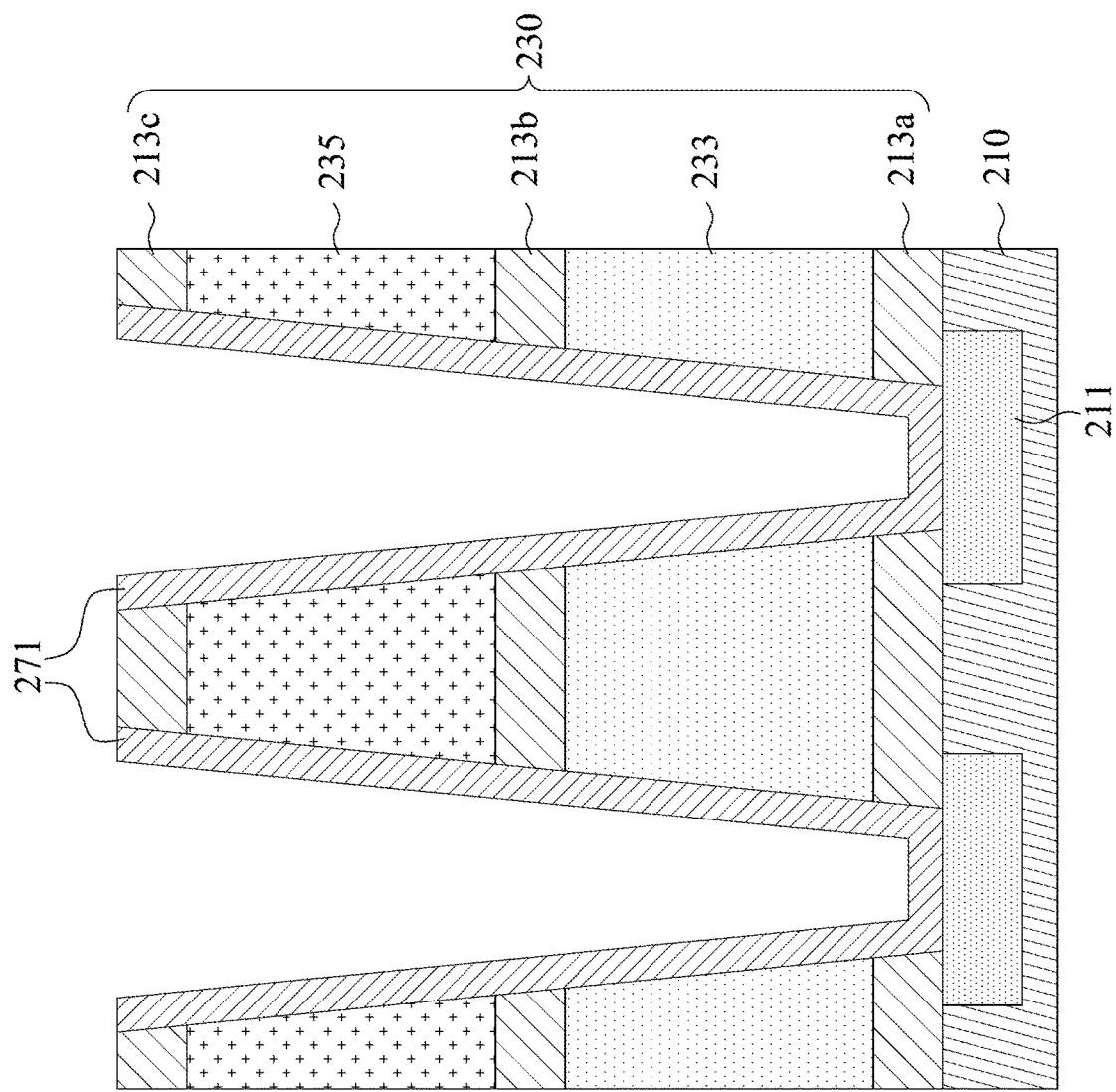

Reference is made to FIG. 3 and FIG. 4. FIG. 3 and FIG. 4 illustrate the details about Step 130 in FIG. 1. The first electrode layer 271 is formed on a surface 251 of the recess 250, such that the first electrode layer 271 is substantially funnel-shaped. Specifically, the surface 251 refers to the sidewall and the bottom surface of the recess 250. In some embodiments of the present disclosure, the first electrode layer 271 may be made of any suitable electrically conductive composition or combination of compositions, such as titanium nitride (TiN). The present disclosure is not limited in this respect.

Figure 5:
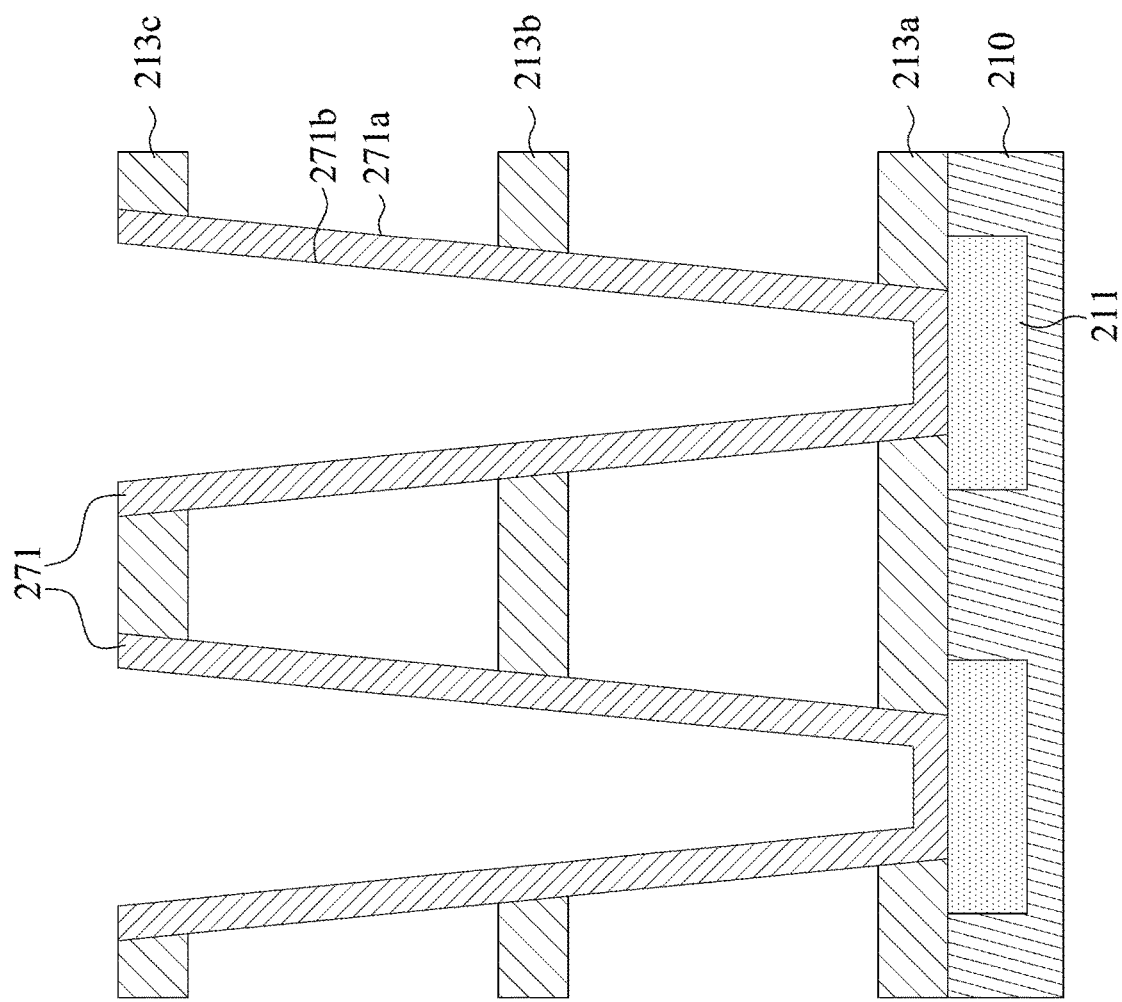

Reference is made to FIG. 4 and FIG. 5. FIG. 4 and FIG. 5 illustrate the details about Step 140 in FIG. 1. The selective etching treatment such as a wet etching treatment is performed to of the multilayer structure 230, such that the first stack material layer 233 and the second stack material layer 235 are removed. In some embodiments of the present disclosure, the wet etching treatment includes exposing the multilayer structure 230 to a solvent which contains hydrogen fluoride (HF). The solvent has high etching selectivity among the stacking layers 233, 235 and the first electrode layer 271. Moreover, the solvent can contains not only hydrogen fluoride (HF) but also ammonium fluoride ($NH_4F$) to selectively remove the stacking layers 233, 235, but the present disclosure is not limited in this respect. In consideration of the removal of the stack material layers 233, 235, the supporting layers 231a, 231b, 231c are configured to prevent the first electrode layer 271 from toppling.

In some embodiments of the present disclosure, Step 104 includes forming an open in each of the second supporting layer 231b and the third supporting layer 231c. Firstly, a first opening extending through the third supporting layer 231c is formed, and thus etching liquid of the selective etching treatment can flow through the first opening to etch the second stack material layer 235. Thereafter, a second opening extending through the second supporting layer 231b is formed, such that the etching liquid can further etch the first stack material layer 233. The first and second openings can be formed by using the aforementioned anisotropic etching process, but the present disclosure is not limited in this respect.

Figure 6:
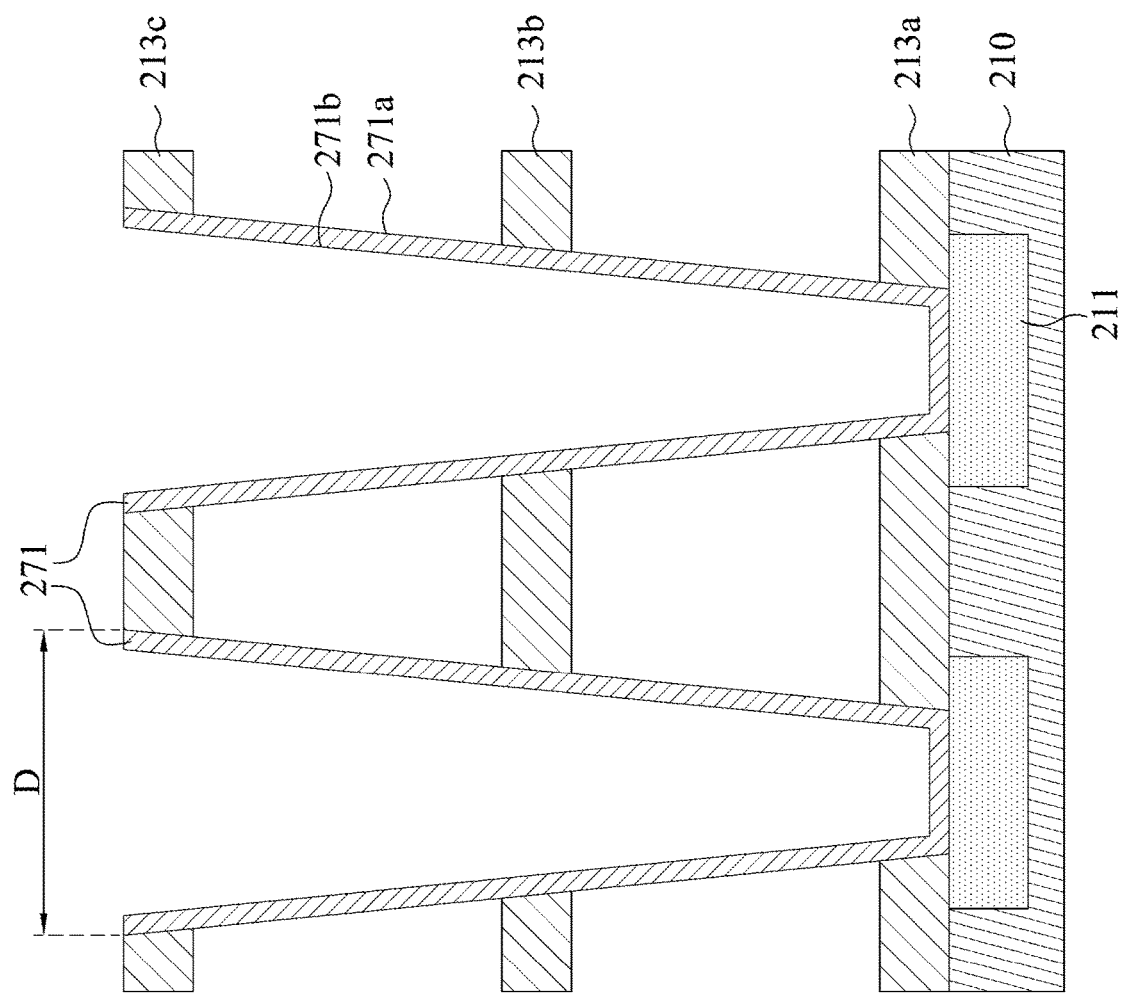

Reference is made to FIG. 5 and FIG. 6. FIG. 5 and FIG. 6 illustrate the details about Step 150 and Step 160 in FIG. 1. In some embodiments of the present disclosure, Step 150 includes exposing the multilayer structure 230 to a protective gas containing hydrogen, such that a protective film is formed over each surface of the supporting layers 231a, 231b, 231c. In some embodiments of the present disclosure, the protective gas includes $H_2$ or $NH_3$. The protective films formed over the supporting layers 231a, 231b, 231c include $Si_3N_4H$, but the present disclosure is not limited in this respect.

In some embodiments of the present disclosure, the Step 150 further includes exposing the substrate 210 to the protective gas containing hydrogen, such that another protective film is formed over the conductive structure 211. The protective film over the conductive structure 211 includes tungsten hydride (WH). The present disclosure is not limited in this respect.

In embodiments of the present disclosure, a selective vapor phase etching treatment is performed to the first electrode layer 271 in Step 160, such that a thickness of the first electrode layer 271 is deducted by at least 2 nm. The conductive structure 211, the multilayer structure 230, and the first electrode layer 271 are exposed to an etching gas containing the fluorine compound, in which two opposite sides 271a, 271b of the first electrode layer 271 are both etched to deduct the thickness thereof. The fluorine compound includes HF, $NF_3$, $CF_4$, or $SF_6$, but the present disclosure is not limited in this respect. The aforementioned protective films, such as the protective films include $Si_3N_4H$ or WH, barely interact with the etching gas containing the fluorine compound. Therefore, there is a high etching selectivity among the conductive structure 211, the supporting layers 231a, 231b, 231c, as well as the first electrode layer 271. When the conductive structure 211 and the supporting layers 231a, 231b, 231c are exposed to the etching gas containing the fluorine compound, the thicknesses thereof substantially maintain the same. On the other hand, the thickness of the first electrode layer 271 decreases by exposing the first electrode layer 271 to the etching gas containing the fluorine compound. In some embodiments of the present disclosure, after performing the selective vapor phase etching treatment to the first electrode layer 271, an outer diameter D of the funnel-shaped first electrode layer 271 is equal to or less than 36 nm.

Figure 7:
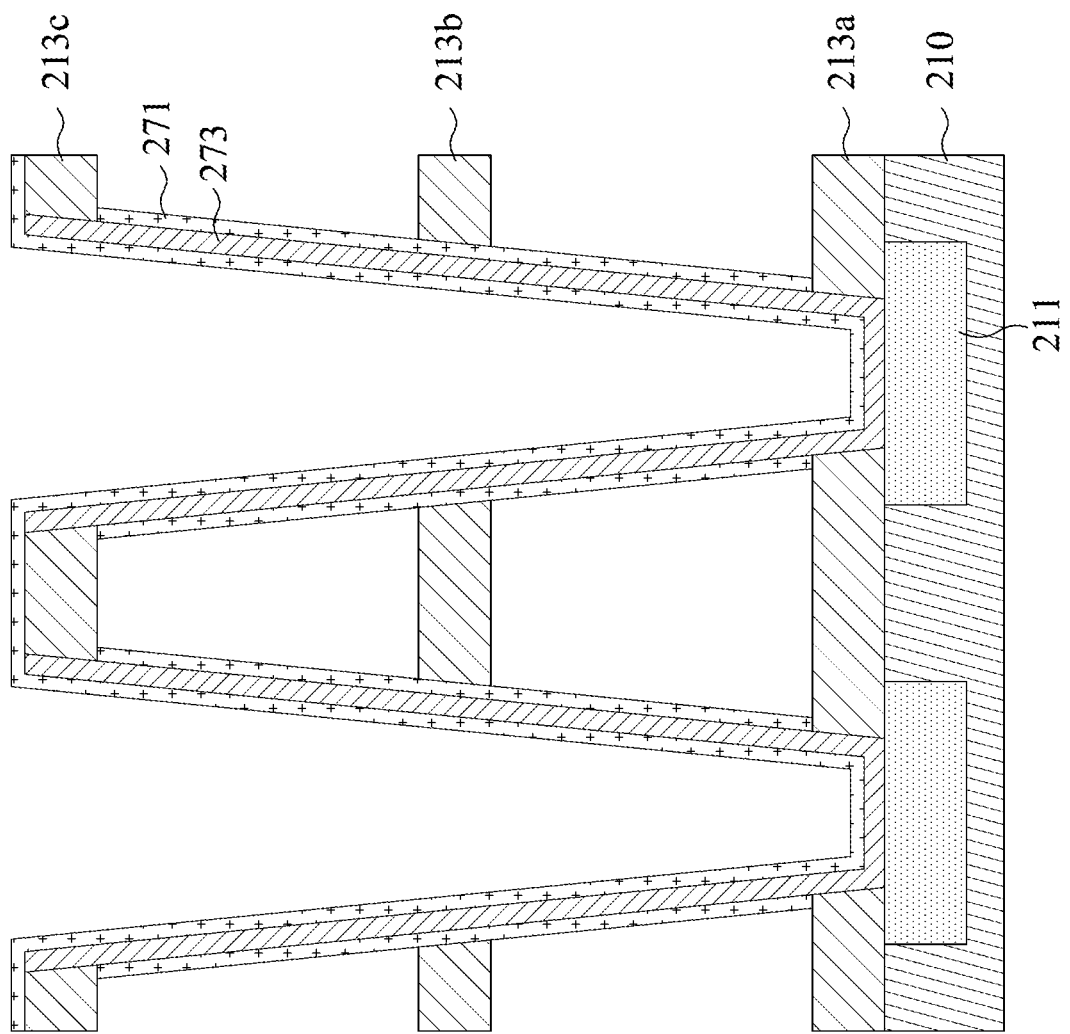
Figure 8:
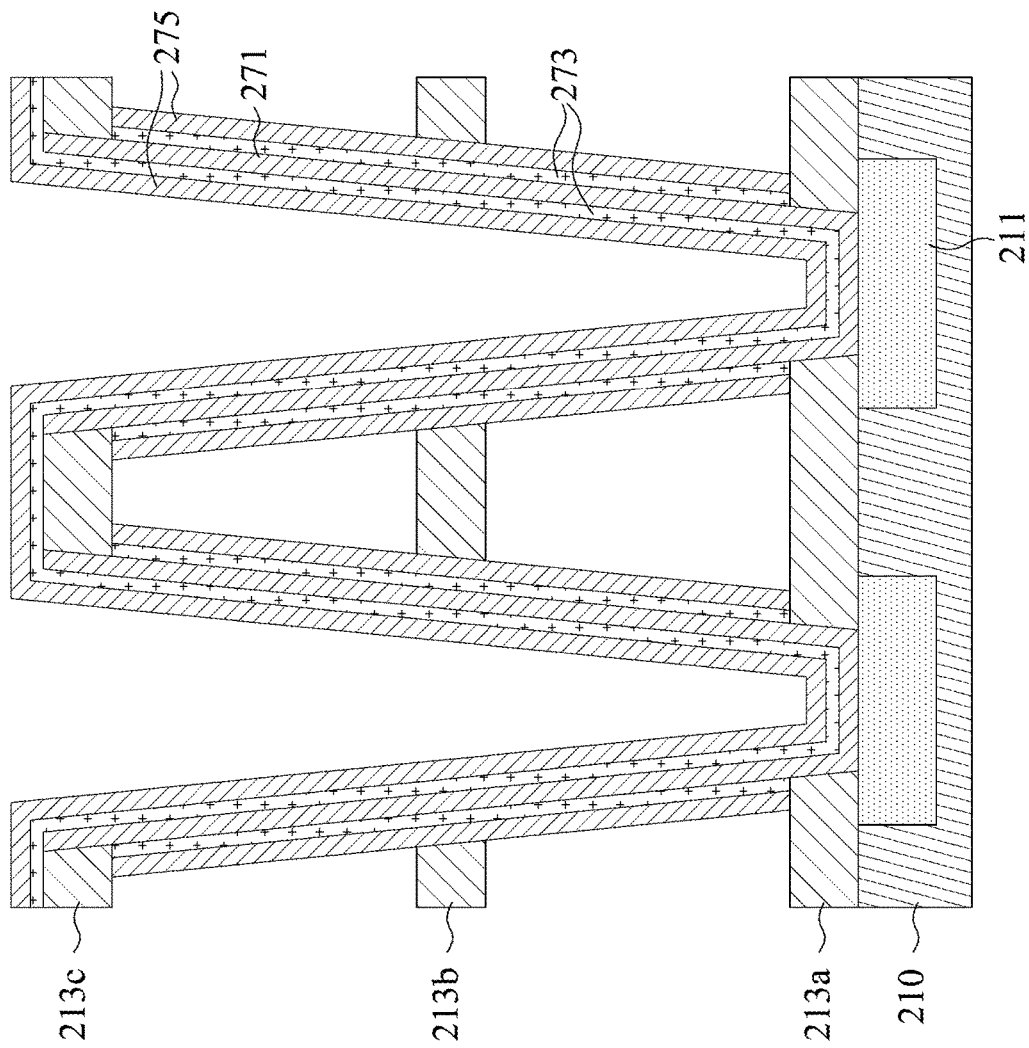

Reference is made from FIG. 6 through FIG. 8. FIG. 6 through FIG. 8 illustrate the details about Step 170 of FIG. 1, and a dielectric layer 273 and a second electrode layer 275 are form over the first electrode layer 271. Specifically, the dielectric layer 273 is formed over the first electrode layer 271, and then the second electrode layer 275 is formed over the dielectric layer 273. Therefore, the dielectric layer 273 is between the first electrode layer 271 and the second electrode layer 275, such that the capacitor 200 is obtained. The dielectric layer 273 includes a high dielectric constant (high-k) dielectric material having a dielectric constant greater than silicon oxide. The second electrode layer 275 may be made of any suitable electrically conductive composition or combination of compositions, such as titanium nitride (TiN). The dielectric layer 273 and second electrode layer 275 can be formed by using any aforementioned deposition process. The present disclosure is not limited in this respect.

It is to be understood that both the foregoing general description and the following detailed description are by examples, and are intended to provide further explanation of the invention as claimed.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a capacitor, comprising:
   providing a substrate and a multilayer structure, wherein the multilayer structure comprises a first supporting layer disposed on the substrate, a first stack material layer on the first supporting layer, a second supporting layer on the first stack material layer, a second stack material layer on the second supporting layer, and a third supporting layer on the second stack material layer;
   forming a recess in the multilayer structure;
   forming a first electrode layer on a surface of the recess;
   performing a selective etching treatment to remove the first and second stack material layers;
   exposing the multilayer structure to a protective gas containing hydrogen before performing a selective vapor phase etching treatment to the first electrode layer, such that a protective film is formed on each exposed surface of the first supporting layer, the second supporting layer, and the third supporting layer;
   performing the selective vapor phase etching treatment to the first electrode layer to form a smaller thickness of the first electrode layer; and
   forming a dielectric layer and a second electrode layer, wherein the dielectric layer is between the first and second electrode layers.

2. The method of claim 1, wherein the first stack material layer comprises borophosphosilicate glass.

3. The method of claim 1, wherein the second stack material layer comprises tetraethyl orthosilicate.

4. The method of claim 1, wherein the first supporting layer, the second supporting layer, and the third supporting layer comprise silicon nitride.

5. The method of claim 1, wherein the first electrode layer comprises titanium nitride.

6. The method of claim 1, wherein performing the selective etching treatment to remove the first and second stack material layers comprises forming an opening in each of the second and third supporting layers.

7. The method of claim 1, wherein the protective gas containing hydrogen includes $H_2$ or $NH_3$.

8. The method of claim 1, wherein the protective film comprises $Si_3N_4H$.

9. The method of claim 1, wherein performing the selective vapor phase etching treatment to the first electrode layer comprises exposing the multilayer structure to an etching gas containing a fluorine compound.

10. The method of claim 9, wherein the fluorine compound comprises HF, $NF_3$, $CF_4$, or $SF_6$.

11. The method of claim 1, wherein the first electrode layer is in contact with a conductive structure in the substrate.

12. The method of claim 11, wherein the conductive structure comprises tungsten.

13. The method of claim 12, further comprising:
   exposing the substrate to a protective gas containing hydrogen before performing the selective vapor phase etching treatment to the first electrode layer, such that a protective film is formed on the conductive structure.

14. The method of claim 13, wherein the protective film comprises tungsten hydride.

15. The method of claim 1, wherein the first electrode layer is funnel-shaped.

16. The method of claim 1, wherein an outer diameter of the first electrode layer equal to or less than 36 nm is obtained after performing the selective vapor phase etching treatment to the first electrode layer.

17. The method of claim 1, wherein a thickness of the first electrode layer is deducted by at least 2 nm after performing the selective vapor phase etching treatment to the first electrode layer.

* * * * *